(12) United States Patent
Watanabe

(10) Patent No.: US 10,622,517 B2
(45) Date of Patent: Apr. 14, 2020

(54) LIGHTING DEVICE AND DISPLAY DEVICE

(71) Applicant: Sharp Kabushiki Kaisha, Sakai, Osaka (JP)

(72) Inventor: Hisashi Watanabe, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 16/097,882

(22) PCT Filed: Aug. 9, 2017

(86) PCT No.: PCT/JP2017/028871
§ 371 (c)(1),
(2) Date: Oct. 31, 2018

(87) PCT Pub. No.: WO2018/034207
PCT Pub. Date: Feb. 22, 2018

(65) Prior Publication Data
US 2019/0148590 A1    May 16, 2019

(30) Foreign Application Priority Data

Aug. 16, 2016 (JP) ................................. 2016-159449

(51) Int. Cl.
*H01L 27/15* (2006.01)
*H01L 33/24* (2010.01)
*H05B 33/08* (2020.01)
*G02F 1/13357* (2006.01)

(52) U.S. Cl.
CPC ........ *H01L 33/24* (2013.01); *G02F 1/133603* (2013.01); *H05B 33/0803* (2013.01); *H05B 33/0842* (2013.01)

(58) Field of Classification Search
CPC ............... H01L 33/24; G02F 1/133603; G05B 33/0803; G05B 33/0842
See application file for complete search history.

(56) References Cited

U.S. PATENT DOCUMENTS

| 2007/0070624 | A1 | 3/2007 | Sun |
| 2008/0310792 | A1* | 12/2008 | Ohtaka ................. G01D 5/353 385/13 |
| 2011/0309381 | A1* | 12/2011 | Betsuda .................... F21S 8/04 257/88 |

(Continued)

FOREIGN PATENT DOCUMENTS

| CN | 1936415 A | 3/2007 |
| JP | 4710859 B2 | 6/2011 |

*Primary Examiner* — Phuc T Dang
(74) *Attorney, Agent, or Firm* — Keating & Bennett, LLP

(57) ABSTRACT

The present application achieves luminance uniformity of a light-emitting region substantially circular in shape, desired high contrast, and low power consumption. A lighting device (1) is configured such that assuming that L is an external diameter of a light-emitting region (E), Xmax is the number of divisions for concentrically dividing the light-emitting region (E), and d is a radial pitch between LEDs (11) which include a centered LED (11) and LEDs (11) arranged substantially concentrically around the centered LED, d=L/(2Xmax+1), and that, in each of the n-th ring regions (Xn), an 8n number of LEDs (11) are arranged at equal pitches in a circumferential direction and are positioned at a distance equivalent to a radius nd from the centered LED (11).

11 Claims, 11 Drawing Sheets

(56) References Cited

U.S. PATENT DOCUMENTS

2012/0286294 A1* 11/2012 Ishizuya ............. H01L 51/5275
  257/80
2014/0036071 A1* 2/2014 Nakamura ............ G01J 1/0422
  348/135
2017/0005287 A1* 1/2017 Suzuki ................ H01L 51/5012

* cited by examiner

| Ring number | Radius for arrangement of LEDs | Number of LEDs in ring region | Total number of LEDs |
|---|---|---|---|
| 0 | — | 1 | 1 |
| 1 | d | 8 | 9 |
| 2 | 2d | 16 | 25 |
| 3 | 3d | 24 | 49 |
| 4 | 4d | 32 | 81 |
| 5 | 5d | 40 | 121 |
| 6 | 6d | 48 | 169 |
| 7 | 7d | 56 | 225 |
| 8 | 8d | 64 | 289 |
| 9 | 9d | 72 | 361 |
| 10 | 10d | 80 | 441 |
| ... | ... | ... | ... |
| X | Xd | 8X | $4X^2+4X+1$ |

Note: X is a natural number.

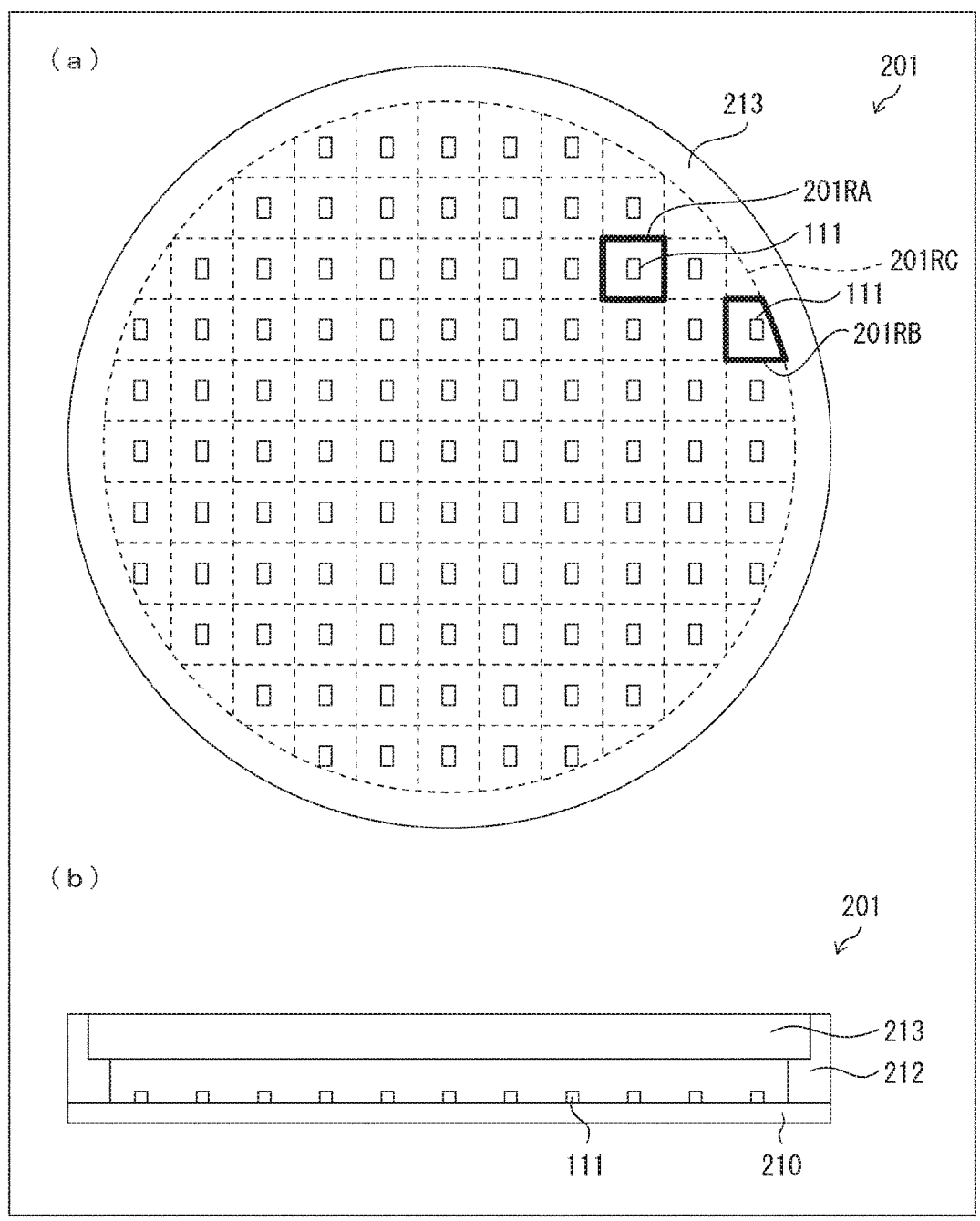

US 10,622,517 B2

LIGHTING DEVICE AND DISPLAY DEVICE

TECHNICAL FIELD

The present invention relates to a lighting device and a display device both of which include a plurality of point light sources arranged therein.

BACKGROUND ART

As a lighting device for lighting the interior of a room or a lighting device used for a backlight of a liquid crystal display device, one known lighting device is a lighting device including LEDs arranged two-dimensionally.

Patent Literature 1 discloses a lighting device, mounted on a wall surface such as a ceiling, for lighting the interior of a room. Such a lighting device includes LEDs arranged concentrically on a circular mounting substrate. As the lighting device for lighting the interior of a room, lighting devices of various planar surface shapes are used such as a circular lighting device, like the lighting device disclosed in Patent Literature 1, and a quadrangular lighting device.

A liquid crystal display device is often designed such that an image display region is quadrangular in shape. Accordingly, a light-emitting region of a backlight for lighting a liquid crystal panel is generally quadrangular in shape, too.

Further, a liquid crystal display device using a direct-type backlight, such as mainly a television, employs the so-called local dimming technique of achieving high contrast and low power consumption by performing luminance control individually on a plurality of divisional regions into which a display region is divided.

(a) of FIG. 11 is a plan view illustrating the configuration of a direct-type rectangular backlight, and (b) of FIG. 11 is a cross-sectional view of the backlight illustrated in (a) of FIG. 11.

The backlight 101 illustrated in FIG. 11 is a backlight employing the local dimming technique. In the backlight 101, LEDs 111 are arranged in rows and columns in a matrix manner on the mounting substrate 110. A surface of the mounting substrate 110 is coated with a material with high reflectivity so as to reflect light beams from the LEDs 111. A diffuser 113 is disposed such that the LEDs 111 are covered with the diffuser 113. The diffuser 113 and the mounting substrate 110 are surrounded at their edges by a frame 112.

The backlight 101 has a light-emitting region rectangular in shape. As indicated by broken lines in (a) of FIG. 11, the areas of divisional regions 101R into which the light-emitting region is divided in a grid pattern are equal.

Thus, allowing the LEDs 111 to emit light beams uniformly makes the divisional regions 101R uniform in luminance. This makes it easy to perform luminance control individually on the divisional regions 101R. Thus, the local dimming technique can be employed with reduced variations in luminance between the divisional regions 101R.

CITATION LIST

Patent Literature

[Patent Literature 1]
Japanese Patent No. 4710859 (Publication date: Jun. 29, 2011)

SUMMARY OF INVENTION

Technical Problem

In recent years, however, a free-form display has been proposed in order to use a liquid crystal display device in various applications. This free-form display may take a shape that contains a curve.

Here, in a backlight employing the local dimming technique, LEDs correspond one-to-one to divisional regions into which the light-emitting region of the backlight is divided. As such, the luminance of each divisional region varies inversely with the area of each divisional region. It may be possible that a circuit for driving the LEDs corrects driving currents supplied to the LEDs. However, since a current rating for the LEDs is determined, correcting the driving currents for the LEDs due to varying areas of the divisional regions causes an average value of corrected driving currents supplied to the LEDs to be lower than an average value of the driving currents supplied to the LEDs without correction of the driving currents for the LEDs. In other words, the luminance becomes lower.

In the backlight 101 known in the art as illustrated in FIG. 11, the light-emitting region is quadrangular in shape, and the areas of the divisional regions 101R are equal. This does not give rise to the problem that the divisional regions 101R have varying areas.

However, in a case where the light-emitting region has a shape that includes curves, it is difficult to uniformly divide the light-emitting region.

(a) of FIG. 12 is a plan view illustrating the configuration of a direct-type circular backlight, and (b) of FIG. 12 is a cross-sectional view of the backlight illustrated in (a) of FIG. 12.

A backlight 201 illustrated in FIG. 12 is a backlight employing the local dimming technique. In the backlight 201, LEDs 111 are arranged in rows and columns in a matrix manner on a mounting substrate 210. A surface of the mounting substrate 210 is coated with a material with high reflectivity so as to reflect light beams from the LEDs 111. A diffuser 213 is disposed such that the LEDs 111 are covered with the diffuser 213. The diffuser 213 and the mounting substrate 210 are surrounded at their edges by a frame 212.

The backlight 201 has a light-emitting region circular in shape. As indicated by broken lines in (a) of FIG. 12, the areas of quadrangular divisional regions 201RA into which the light-emitting region is divided in a grid pattern are equal, whereas the areas of non-quadrangular divisional regions 201RB including curved parts provided at the edge of the light-emitting region are smaller than those of the divisional regions 201RA. Further, divisional regions 201RC including curved parts provided at the edge of the light-emitting region and having no LEDs 111 arranged therein, each need to be lit by the LED 111 arranged in an adjacent one of the divisional regions 201RA. As such, a substantial area of such an adjacent divisional region 201RA is an area obtained by adding the area of the divisional region 201RC to the area of the adjacent divisional region 201RA.

As described above, the backlight 201 has divisional regions RA, RB, and RC of varying areas. This makes the whole of the light-emitting region nonuniform in luminance. Furthermore, the divisional regions RA, RB, and RC are nonuniform in luminance. This makes it impossible to achieve desired high contrast and low power consumption even though the local dimming technique is employed of performing luminance control on the light-emitting region on an individual predetermined region basis.

The present invention has been made in view of the above problem, and it is an object of the present invention to obtain a lighting device that (i) has a light-emitting region uniform in luminance even when the light-emitting region is substantially circular in shape and (ii) achieves desired high contrast and low power consumption by performing luminance control on an individual predetermined region basis.

Solution to Problem

In order to solve the above problem, a lighting device in accordance with an aspect of the present invention is configured such that assuming that L is an external diameter of a light-emitting region for lighting an image display region of an image display panel, Xmax is the number of divisions for concentrically dividing the light-emitting region into substantially concentric ring-shaped regions, the substantially concentric ring-shaped regions are expressed as n-th ring regions (where n is an integer satisfying 0≤n≤Xmax), and d is a radial pitch between point light sources which include a centered point light source and point light sources arranged substantially concentrically around the centered point light source, d=L/(2Xmax+1), and that, in each of the n-th ring regions, an 8n number of the point light sources are arranged at equal pitches in a circumferential direction and are positioned at a distance equivalent to a radius nd from the centered the point light source around which the point light sources arranged substantially concentrically are positioned.

Advantageous Effects of Invention

According to an aspect of the present invention, an effect is yielded of obtaining a lighting device that (i) has a light-emitting region uniform in luminance even when the light-emitting region is substantially circular in shape and (ii) achieves desired high contrast and low power consumption by performing luminance control on an individual predetermined region basis.

Figure 7:
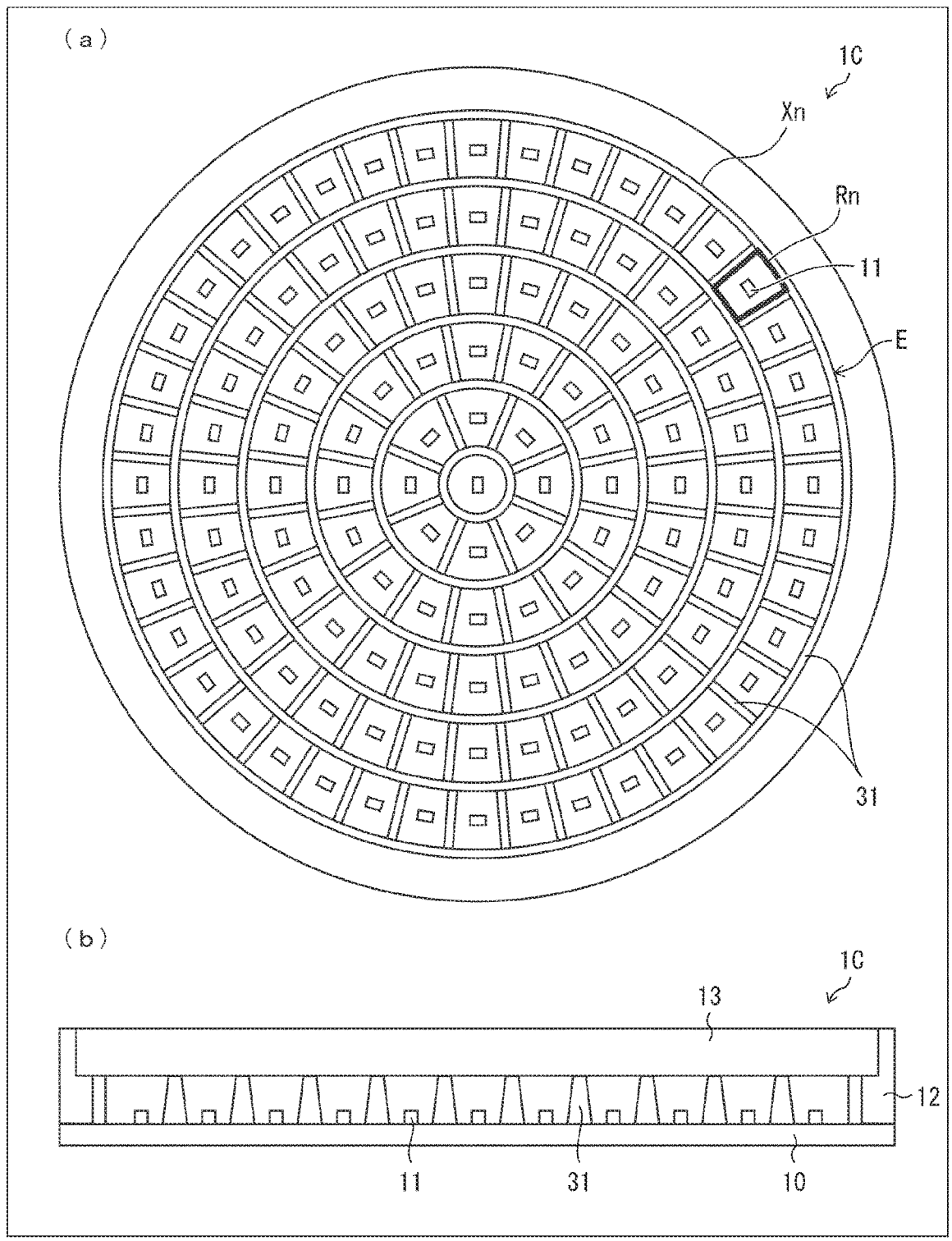

(a) of FIG. 7 is a plan view illustrating the configuration of a lighting device 1C in accordance with Embodiment 4 of the present invention, and (b) of FIG. 7 is a cross-sectional view of the lighting device 1C illustrated in (a) of FIG. 7.

Figure 8:
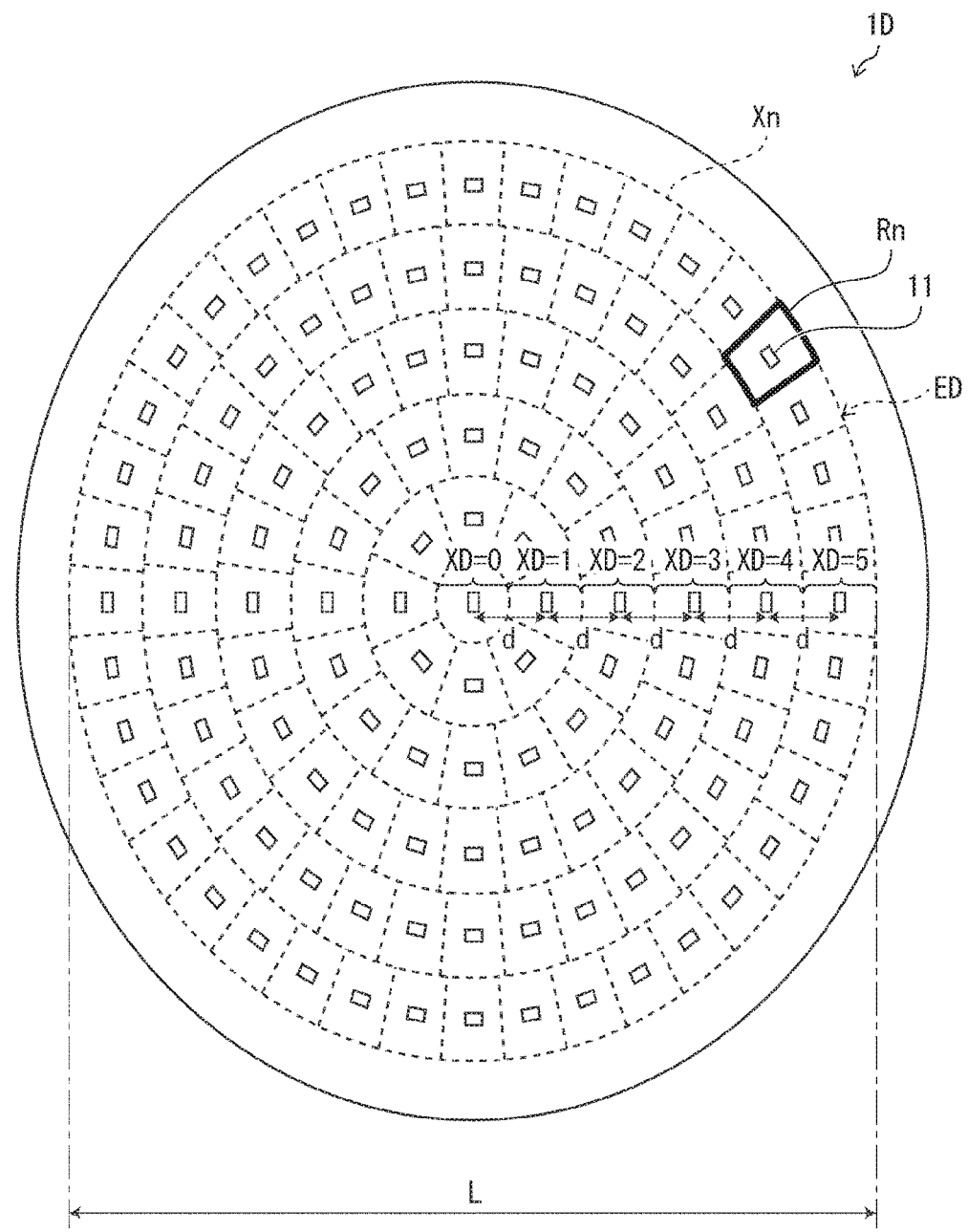

FIG. 8 is a plan view illustrating the configuration of a lighting device in accordance with Embodiment 5 of the present invention.

Figure 9:
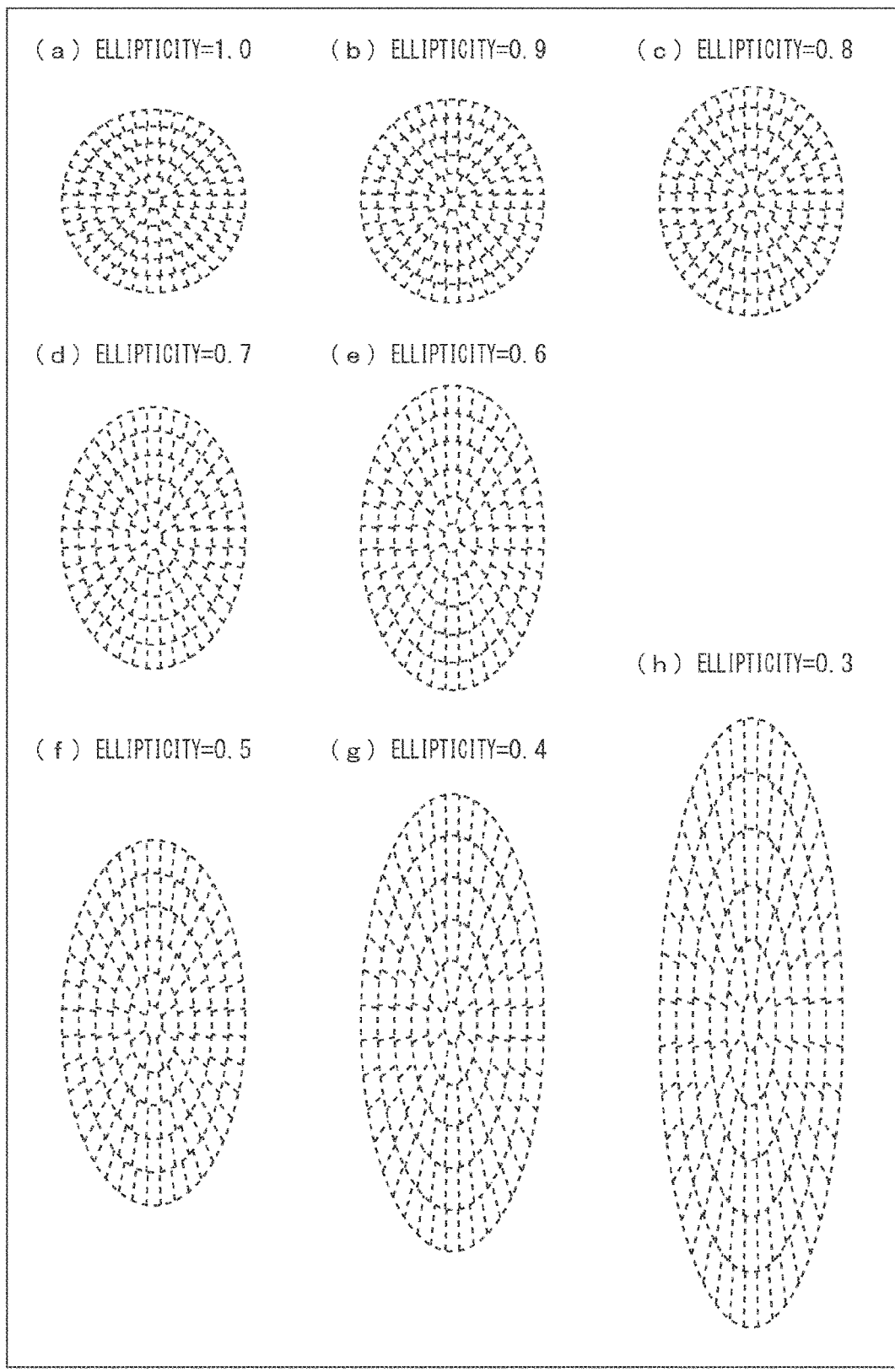

FIG. 9 is a plan view illustrating light-emitting regions having varying ellipticities.

Figure 10:
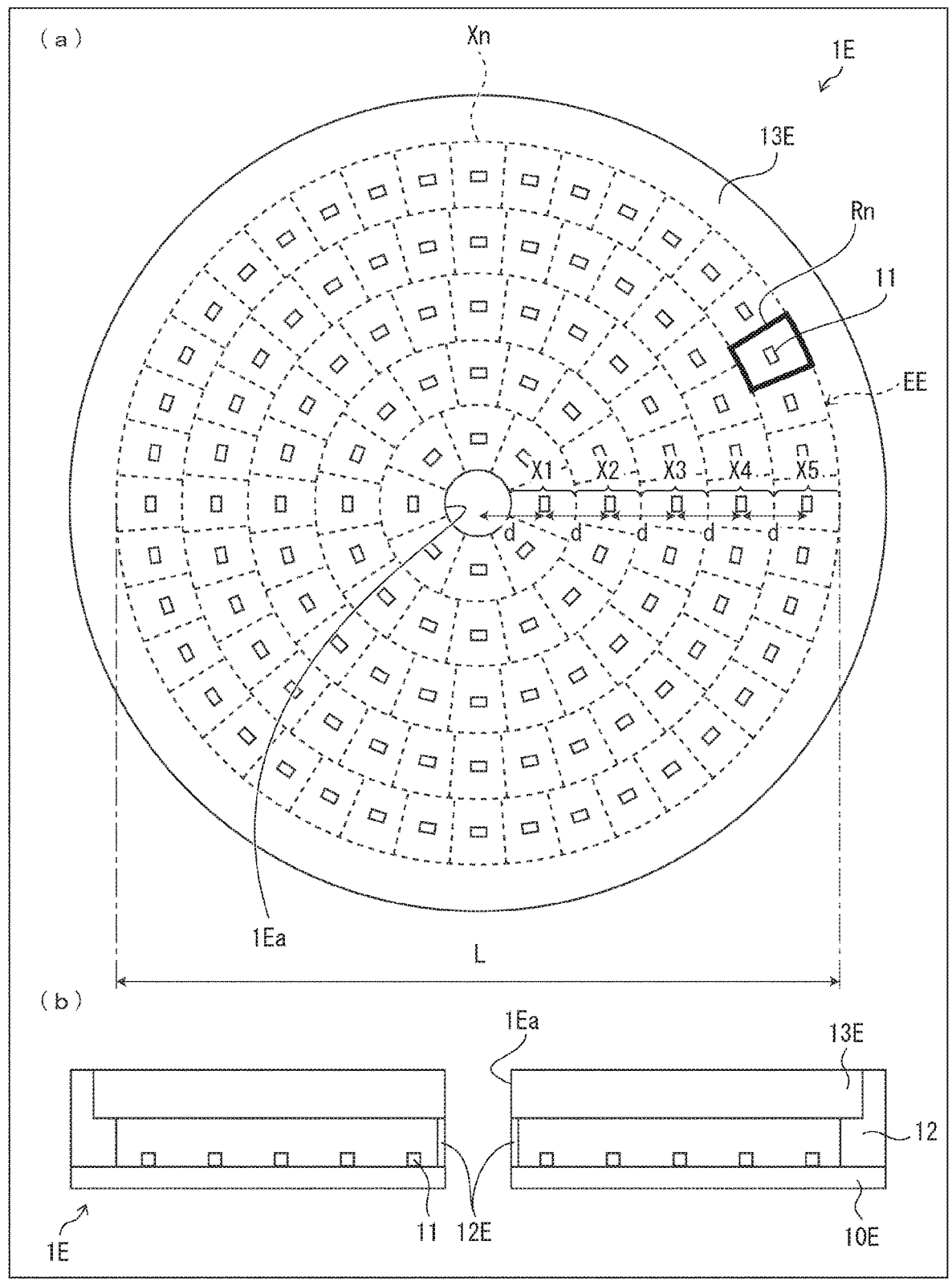

(a) of FIG. 10 is a plan view illustrating the configuration of a lighting device in accordance with Embodiment 6 of the present invention, and (b) of FIG. 10 is a cross-sectional view illustrating the configuration of the lighting device illustrated in (a) of FIG. 10.

Figure 11:
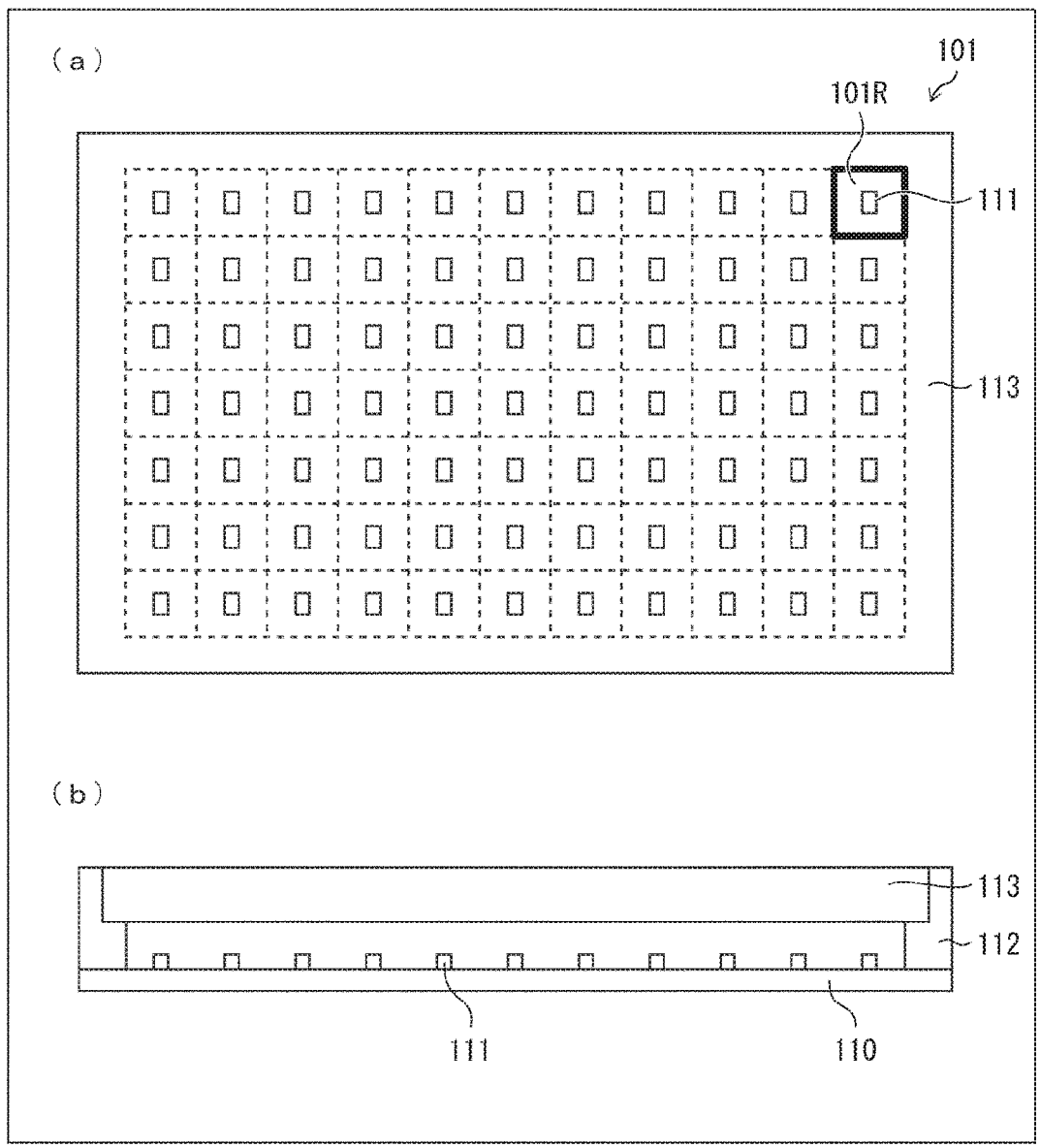

(a) of FIG. 11 is a plan view illustrating the configuration of a direct-type rectangular backlight, and (b) of FIG. 11 is a cross-sectional view of the backlight illustrated in (a) of FIG. 11.

(a) of FIG. 12 is a plan view illustrating the configuration of a direct-type circular backlight, and (b) of FIG. 12 is a cross-sectional view of the backlight illustrated in (a) of FIG. 12.

DESCRIPTION OF EMBODIMENTS

Embodiment 1

The following description will discuss details of Embodiment 1 of the present invention. First, the configuration of a display device 30 in which a lighting device 1 is used will be discussed with reference to FIG. 2.

Figures 2, 3:
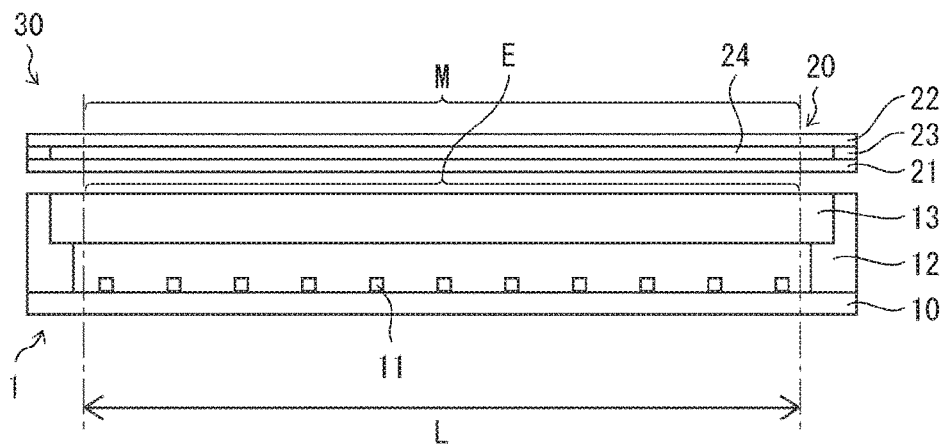
FIG. 2 is a cross-sectional view illustrating the configuration of a display device in which the lighting device is used, in accordance with Embodiment 1 of the present invention.
FIG. 3 is a diagram showing a method of arranging LEDs in each of ring regions.

FIG. 2 is a cross-sectional view illustrating the configuration of the display device 30 in which the lighting device 1 is used, in accordance with Embodiment 1 of the present invention. As illustrated in FIG. 2, the display device 30 includes: a liquid crystal panel (image display panel) 20; and the lighting device 1 configured to light the liquid crystal panel 20 from behind.

The liquid crystal panel 20 includes: an element substrate 21, a counter substrate 22, and a seal 23, and a liquid crystal layer 24. The element substrate 21 has switching elements such as TFTs for pixel driving arranged thereon corresponding one-to-one to pixels. The counter substrate 22 is disposed opposite the element substrate 21 with the liquid crystal layer 24 provided between the element substrate 21 and the counter substrate 22. The seal 23 is provided to bond the element substrate 21 and the counter substrate 22.

In the liquid crystal panel 20, a display region (image display region) M is a region where an image is to be displayed. The display region M of the liquid crystal panel 20 can be expressed as a region in which pixels for displaying an image are arranged in a matrix manner.

The lighting device 1 is a direct-type backlight. The lighting device 1 includes a mounting substrate 10, a plurality of LEDs (point light sources) 11, a frame 12, and a diffuser 13.

In the lighting device 1, a light-emitting region E is a region that faces the display region M of the liquid crystal panel 20. The light-emitting region E is a region for lighting the display region M of the liquid crystal panel 20.

The LEDs 11 are mounted on a surface of the mounting substrate 10. The LEDs 11 are arranged within the light-emitting region E. In Embodiment 1, the LED 11 is assumed to be an LED that emits white light.

The LEDs 11 are connected to an external circuit via, for example, a flat cable (not illustrated) and can be turned on with brightness specified individually. That is, the LEDs 11 are adaptable for local dimming.

The mounting substrate 10 has a member with high reflectivity disposed on its surface. For example, the member with high reflectivity disposed on the surface of the mounting substrate 10 can be (a) a film formed by, for example, application of a coating of white resist or (b) a reflective sheet having openings provided in a region where the LEDs are arranged. With this configuration, light beams emitted from the LEDs 11 are reflected by the surface of the mounting substrate 10 and are then efficiently exited to the outside of the lighting device 1.

The diffuser 13 covers a plurality of LEDs 11 mounted on the mounting substrate 10. The diffuser 13 is a diffuser for diffusing outgoing light beams from the LEDs 11 to make a uniform surface light source. The diffuser 13 may include a prism sheet or a polarized light reflecting sheet.

The frame 12 encloses the edges of the mounting substrate 10 and the diffuser 13. The frame 12 supports the diffuser 13 and is fixed onto the mounting substrate 10. The frame 12 can be made from, for example, white resin such as polycarbonate. The frame 12 allows light beams emitted from the LEDs 11 to be confined in the region surrounded by the frame 12 so as to prevent the light beams from being leaked from the frame 12. This is effective in increasing the luminance of light exited to the outside of the lighting device 1 through the diffuser 13.

Figure 1:
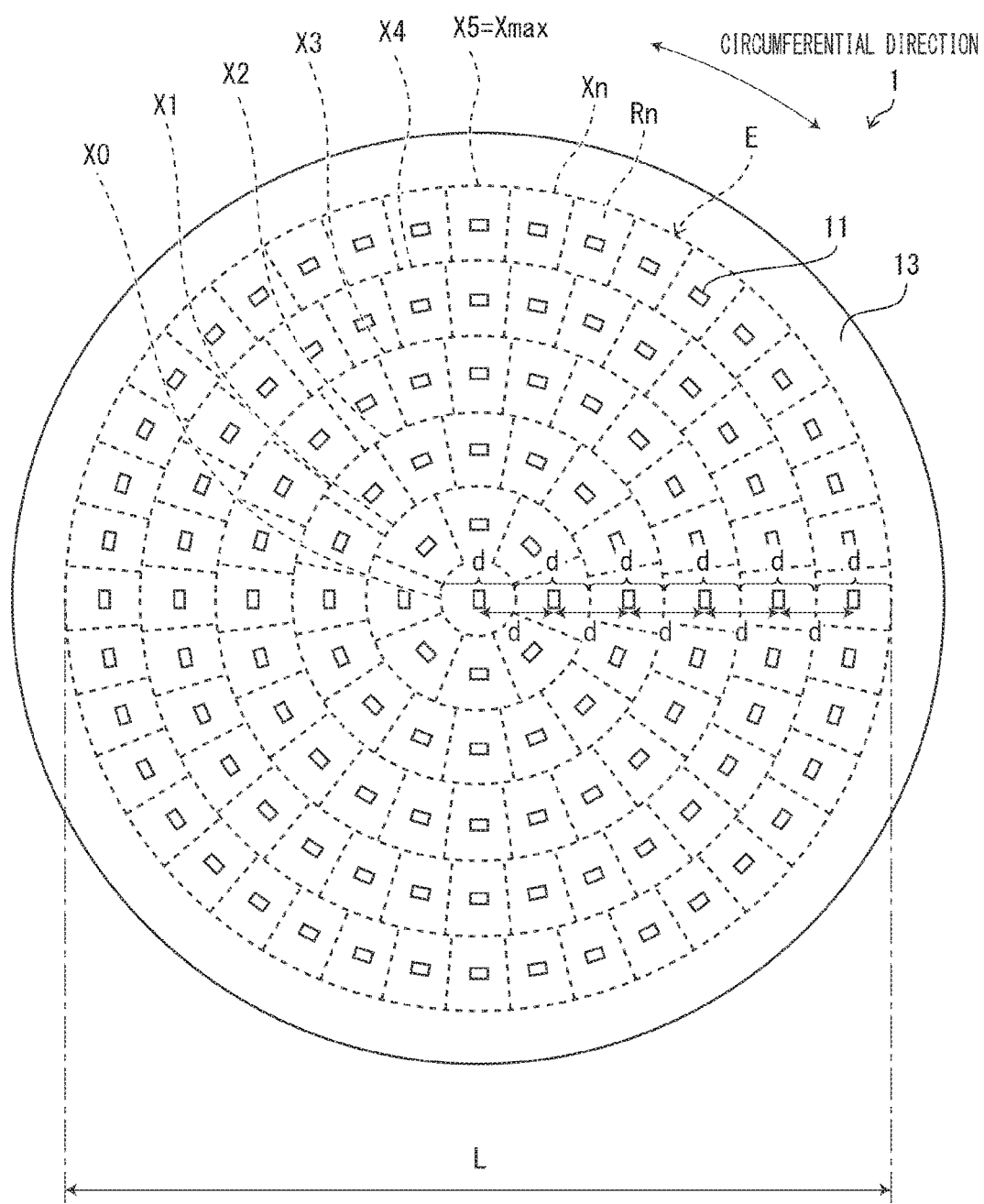
FIG. 1 is a plan view illustrating the configuration of a lighting device in accordance with Embodiment 1 of the present invention.

FIG. 1 is a plan view illustrating the configuration of the lighting device 1 in accordance with Embodiment 1 of the present invention.

As illustrated in FIG. 1, in Embodiment 1, the lighting device 1 is circular in outer shape when viewed from above. That is, the diffuser 13 and the mounting substrate 10 are circular in shape. The light-emitting region E of the lighting device 1 is circular in shape, too. Further, the display region M (see FIG. 1) facing the light-emitting region E of the lighting device 1 is circular in shape, too. The lighting device 1 is only required that the light-emitting region E is circular in shape, and the outer shape of the lighting device 1 is not necessarily circular in shape.

The LEDs 11 are arranged substantially concentrically on the mounting substrate 10. The LEDs 11 are arranged such that a direction of the length of each of the LEDs 11 extends in a circumferential direction of the light-emitting region E.

As discussed earlier, the member of high reflectivity is disposed on the surface of the mounting substrate 10. Therefore, not only light beams passing directly through the diffuser 13 from the LEDs 11, but also light beams reflected by the surface of the mounting substrate 10 into the diffuser 13 and passing through the diffuser 13, are exited to the outside of the lighting device 1.

Thus, in the light-emitting region E, it can be considered that the surface of the mounting substrate 10 where the LEDs 11 are arranged also serves as a light source.

In FIG. 1, divisional regions Rn into which the light-emitting region E is divided are indicated by broken lines. Each of the divisional regions Rn contains a corresponding one of the LEDs 11 and a corresponding one of their surroundings.

The divisional regions Rn are regions that are considered to be virtual light sources. There is no partition or the like between the divisional regions Rn. Thus, in a case where a corresponding one of the LEDs 11 (target LED 11) in one of the divisional regions Rn is turned on, it does not mean that only the divisional region Rn containing the target LED 11 is clearly lit in a state of being distinguished from the other divisional regions Rn. Instead, light from the target LED 11 contained in the divisional region Rn spreads out toward its adjacent divisional region Rn is lit in the adjacent divisional region Rn.

Thus, even in a case where there are some variations in the areas of the divisional regions Rn, variations in luminance between the divisional regions Rn are reduced. It is, however, preferable that the areas of the divisional regions Rn are equal. This is because the divisional regions Rn of equal area result in reduction of variations in luminance between the divisional regions Rn; that is, increase in uniformity of luminance between the divisional regions Rn.

In a case where local dimming in particular is performed, the divisional regions Rn of equal area allow for more effective local dimming.

(Manner of Arrangement of LEDs 11)

The manner of sectioning into the above-discussed divisional regions Rn is determined depending on the arrangement of the LEDs 11.

Next, a method of arranging the LEDs 11 for equalizing the areas of the divisional regions Rn in the light-emitting region E will be discussed with reference to FIGS. 1 and 3. FIG. 3 is a diagram showing the method of arranging the LEDs 11 in each of ring regions.

As illustrated in FIG. 1, assume that L is a diameter of the circular light-emitting region E, and d is a radial pitch between the LEDs 11 arranged concentrically.

In addition, in the light-emitting region E, a central region R0 (zeroth ring region X0) and annular regions into which a region extending outward from the central region R0 is virtually divided are referred to as below.

That is, a circular region having a diameter equivalent to d and centering around the LED 11 which is disposed at the center of the light-emitting region E is referred to as the central region R0 (zeroth ring region X0), an annular region being located just outside the central region R0 so as to surround the central region R0 and having a radial length equivalent to d is referred to as a first ring region X1, an annular region being located just outside the first ring region X1 so as to surround the first ring region X1 and having a radial length equivalent to d is referred to as a second ring region X2, and an annular region being located just outside the second ring region X2 so as to surround the second ring region X2 and having a radial length equivalent to d is referred to as a third ring region X3.

Similarly, an annular region being located just outside the third ring region X3 so as to surround the third ring region X3 and having a radial length equivalent to d is referred to as a fourth ring region X4, an annular region being located just outside the fourth ring region X4 so as to surround the fourth ring region X4 and having a radial length equivalent to d is referred to as a fifth ring region X5, . . . , an annular region being located just outside the (n−1)th ring region Xn−1 so as to surround the (n−1)th ring region Xn−1 and having a radial length equivalent to d is referred to as an n-th ring region Xn. Note that n is a natural number.

In FIG. 1, the central region R0 through the fifth ring region X5 are represented.

The number of annular regions including the central region R0 is referred to as a "ring number". The central region R0 is given a ring number "0", the first ring region X1 is given a ring number "1", the second ring region X2 is given a ring number "2", and the n-th ring region Xn is given a ring number "n".

Note that in a case where it is unnecessary to identify the positions of the central region R0 and the annular regions into which the light-emitting region E is divided, they can be referred to as "ring region(s) X".

As shown in FIG. 3, the layout of the LEDs 11 in each of the ring regions X is predetermined as below.

That is, in the central region R0 (zeroth ring region) whose ring number is "0", one LED 11 is arranged.

In the first ring region X1 whose ring number is "1", eight LEDs 11 are arranged at equal pitches in the circumferential direction and are positioned at a distance equivalent to a radius $d$ from the LED 11 which is arranged in the central region R0. In the second ring region X2 whose ring number is "2", 16 LEDs 11 are arranged at equal pitches in the circumferential direction and are positioned at a distance equivalent to a radius $2d$ from the LED 11 which is arranged in the central region R0.

In the third ring region X3 whose ring number is "3", 24 LEDs 11 are arranged at equal pitches in the circumferential direction and are positioned at a distance equivalent to a radius $3d$ from the LEDs 11 which are arranged in the second ring region X2. In the fourth ring region X4 whose ring number is "4", 32 LEDs 11 are arranged at equal pitches in the circumferential direction and are positioned at a distance equivalent to a radius $4d$ from the LEDs 11 which are arranged in the third ring region X3. In the fifth ring region X5 whose ring number is "5", 40 LEDs are arranged at equal pitches in the circumferential direction and are positioned at a distance equivalent to a radius $5d$ from the LED 11 which is arranged in the central region R0. In the n-th ring region Xn whose ring number is "n", 8n LEDs 11 are arranged at equal pitches in the circumferential direction and are positioned at a distance equivalent to a radius $nd$ from the LED 11 which is arranged in the central region R0.

By using the method discussed above, the LEDs 11 are mounted on the mounting substrate 10 as below.

Before the LEDs 11 are mounted on the mounting substrate 10, a maximum ring number Xmax indicating how many annular regions the light-emitting region E is divided into is determined. In other words, a maximum number of n is determined.

In light of the size of the image display region M (see FIG. 2) and the application of the display device 30, luminance and costs demanded of the display device 30 are determined. In other words, depending on the specifications of the lighting device 1, the number of LEDs 11 that can be used in the lighting device 1 is roughly determined. Thus, the maximum ring number Xmax is determined accordingly.

For example, the number of LEDs 11 to be used in a mobile device such as a smart phone is 9 or 25. Referring to FIG. 3, the maximum ring number Xmax for the mobile device is 1 (n=1) or 2 (n=2). Further, the number of LEDs 11 to be used in a notebook computer is 49 to 169. Referring to FIG. 3, the maximum ring number Xmax for the notebook computer is 3 (n=3) to 6 (n=6). Still further, the number of LEDs 11 to be used in a monitor is 81 to 289. Thus, the maximum ring number Xmax for the monitor is 4 (n=4) to 8 (n=8). Yet further, the number of LEDs 11 to be used in a television is 361 to 1681. Thus, the maximum ring number Xmax for the television is 9 (n=9) to 20 (n=20). Note that, for an ultra-large-screen television and an ultra-high-definition television, ring numbers for them can be more than the ring numbers given above.

(2) Next, a radial pitch d between the LEDs 11 in the light-emitting region E is calculated as follows:

$$d=L/(2X\text{max}+1).$$

(3) Then, one LED 11 is mounted at the center of the central region R0 (zeroth ring region X0). Further, as discussed with reference to FIG. 3, in the n-th ring region Xn, 8n LEDs 11 are arranged at equal pitches in the circumferential direction and are positioned at a distance equivalent to a radius nd from the LED 11 which is arranged in the central region R0.

The divisional regions Rn are divisional regions into which the n-th ring region Xn is equally divided in the circumferential direction by 8n, which is the number of LEDs 11 arranged in the n-th ring region Xn, with the LEDs 11 located at the center of the divisional regions.

(Area of Divisional Region Rn)

Figure 4:
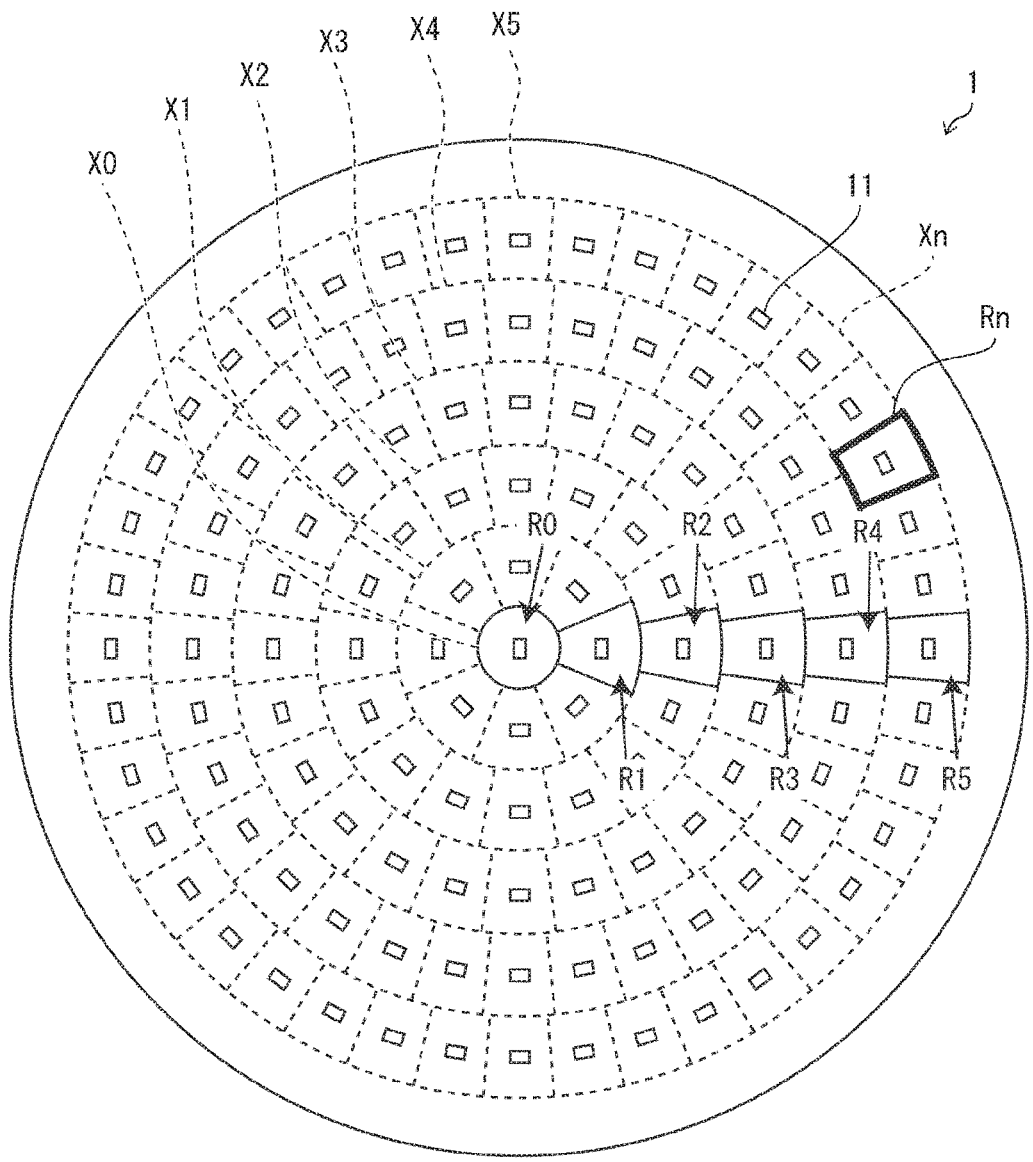
FIG. 4 is a view illustrating a central region and divisional regions of each n-th ring region in a light-emitting region.

FIG. 4 is a view illustrating the central region R0 and the divisional regions Rn of each n-th ring region Xn in the lighting device 1. With reference to FIG. 4, the following will explain that the areas of the divisional regions Rn are equal.

Since the central region R0 (zeroth ring region X0) is shaped in a circle having a radius d, the area of the central region R0 is expressed as $\pi(d/2)^2$.

Assuming that the area of each divisional region R1 in the first ring region X1 is R1, the area R1 can be calculated as follows:

$$R1 = (\pi(3d/2)^2 - \pi(d/2)^2)/8 = 8\pi(d/2)^2/8 = \pi(d/2)^2$$

Assuming that the area of each divisional region R2 in the second ring region X2 is R2, the area R2 can be calculated as follows:

$$R2 = (\pi(5d/2)^2 - \pi(3d/2)^2)/16 = 16\pi(d/2)^2/16 = \pi(d/2)^2$$

The area R3 of each divisional region R3 in the third ring region X3, the area R4 of each divisional region R4 in the fourth ring region X4, and the area R5 of each divisional region R5 in the fifth ring region X5 can be calculated similarly.

Specifically, each divisional region Rn in the n-th ring region Xn can be calculated as follows:

$$Rn=(\pi((2n+1)d/2)^2-\pi((2n-1)d/2)^2)/8n=8n\pi(d/2)^2/8n=\pi(d/2)^2$$

Thus, as explained with reference to FIG. 3, setting each of divisional regions Rn in each of ring regions Xn allows the areas of the divisional regions Rn to be all equal to $\pi(d/2)^2$.

Main Advantages

As described above, the lighting device 1 is such that, assuming that L is an external diameter of the circular light-emitting region E for lighting the display region M of the liquid crystal panel 20, Xmax is the number of divisions for concentrically dividing the light-emitting region E into concentric ring-shaped regions, the concentric ring-shaped regions are expressed as n-th ring regions (where n is an integer satisfying 0≤n≤Xmax), and d is a radial pitch between LEDs 11 which include a centered LED 11 and LEDs 11 arranged concentrically around the centered LED 11, $d=L/(2X_{max}+1)$, and that, in each of the n-th ring regions Xn, an 8n number of the LEDs 11 are arranged at equal pitches in a circumferential direction and are positioned at a distance equivalent to a radius nd from the centered LED 11 around which the LEDs 11 arranged concentrically are positioned.

Thus, the areas of the divisional regions Rn into which each of the n-th ring regions Xn is equally divided in the circumferential direction such that each of the divisional regions Rn contains one or more of the LEDs 11 are equal. The areas of the divisional regions Rn in all of the n-th ring regions Xn where n is 0 through Xmax are equal, too.

That is, as discussed with reference to FIG. 4, the areas of the following regions: the central region R0, the divisional region R1 in the first ring region X1, the divisional region R2 in the second ring region X2, . . . , and the divisional region Rn in the n-th ring region Xn are all $\pi(d/2)^2$ and are all equal.

This makes the divisional regions Rn uniform in luminance. This consequently makes the light-emitting region E uniform in luminance even in a case where the light-emitting region E is circular in shape. Furthermore, the lighting device 1, in which the areas of the divisional regions Rn are not varied, achieves desired high contrast and low power consumption as expected even though the lighting device 1 employs the so-called local dimming technique of performing luminance control on the light-emitting region E on an individual predetermined region basis.

Note that the light-emitting region E is preferably circular in shape. This makes it possible to make the divisional regions Rn uniform in luminance with reliability. However, the shape of the light-emitting region is not limited to a circular shape. Alternatively, the light-emitting region may have a substantially circular shape deformed from a perfect circle, such as an elliptical shape. This structure also makes it possible to make the divisional regions uniform in luminance in comparison with the conventional structure (see FIG. 12).

Embodiment 2

Figure 5:
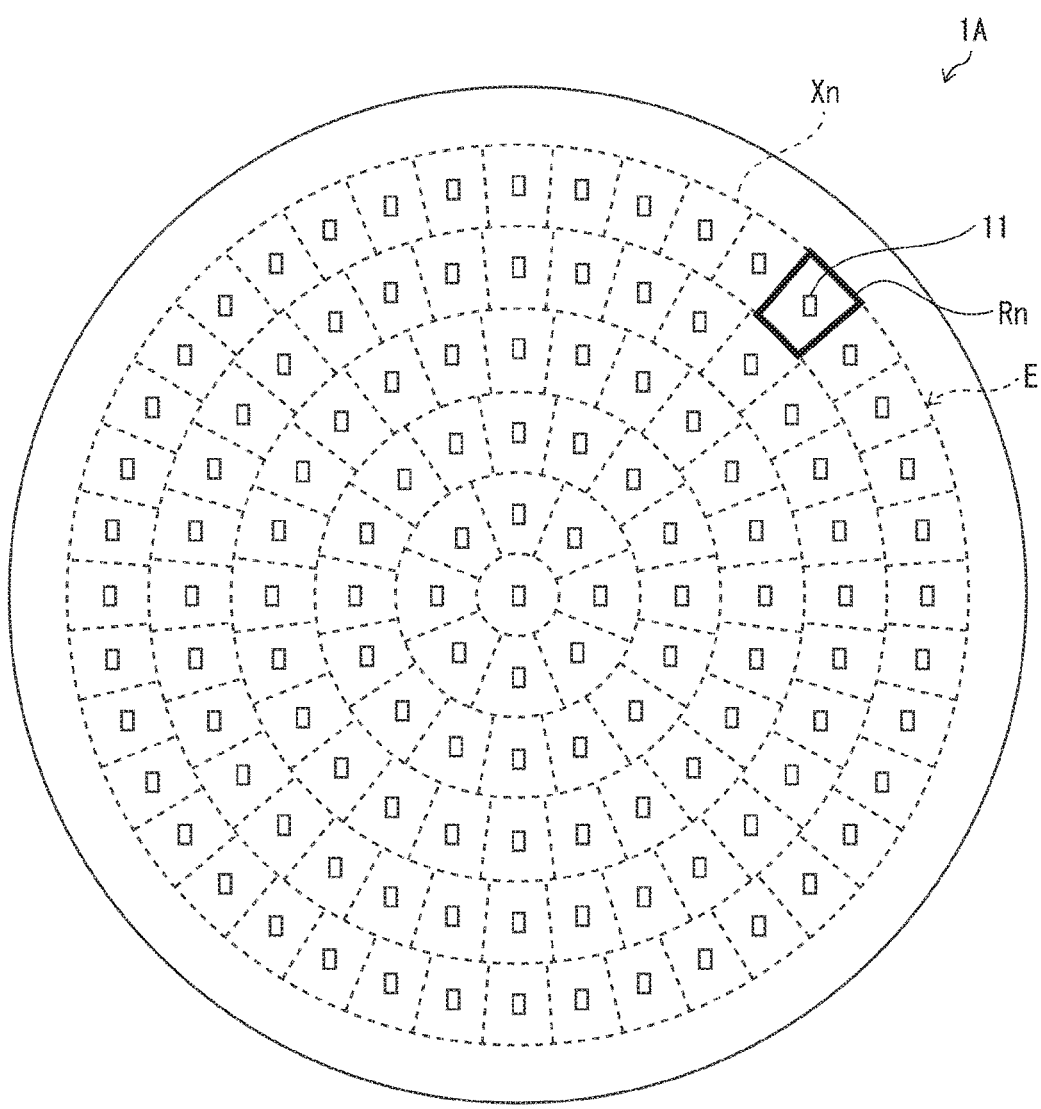
FIG. 5 is a plan view illustrating the configuration of a lighting device in accordance with Embodiment 2 of the present invention.

The following description will discuss another embodiment of the present invention with reference to FIG. 5. For convenience of explanation, members having the same functions as those described in Embodiment 1 are given the same reference numerals, and explanations thereof are omitted here.

FIG. 5 is a plan view illustrating the configuration of a lighting device 1A in accordance with Embodiment 2 of the present invention.

The longitudinal lengths of the LEDs 11 can be pointed in any direction. As in the lighting device 1A, the LEDs 11 can be arranged parallel to each other in such a manner that the longitudinal lengths of the LEDs 11 are pointed in one direction. In the lighting device 1A with such a configuration, the areas of the divisional regions Rn are also equal. Thus, it is possible to make the divisional regions Rn uniform in luminance. Furthermore, the lighting device 1A, in which the areas of the divisional regions Rn are not varied, achieves desired high contrast and low power consumption as expected even though the lighting device 1A employs the so-called local dimming technique of performing luminance control on the light-emitting region E on an individual predetermined region basis.

Embodiment 3

Figure 6:
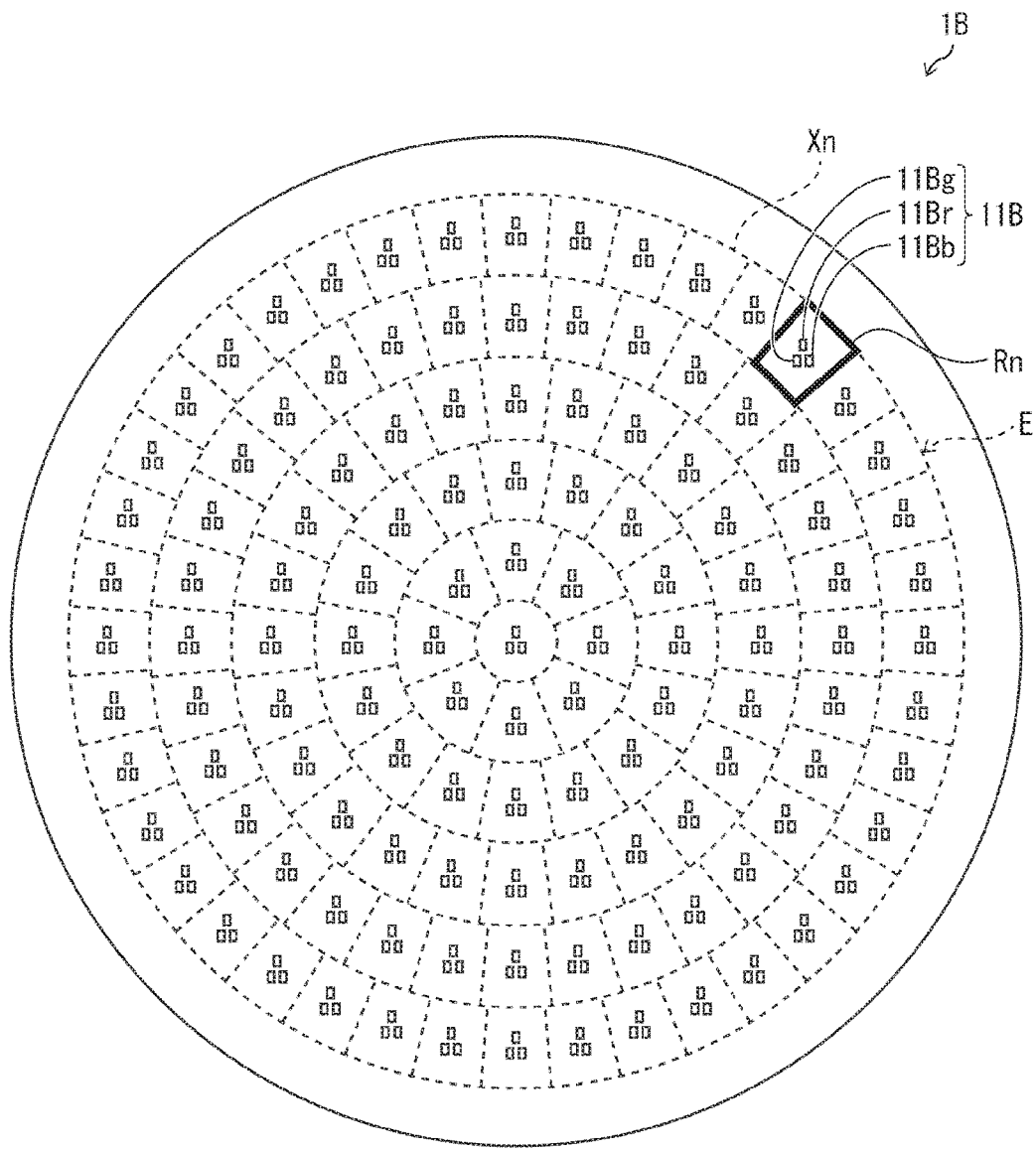
FIG. 6 is a plan view illustrating the configuration of a lighting device in accordance with Embodiment 3 of the present invention.

The following description will discuss still another embodiment of the present invention with reference to FIG. 6. For convenience of explanation, members having the same functions as those described in Embodiments 1 and 2 are given the same reference numerals, and explanations thereof are omitted here.

FIG. 6 is a plan view illustrating the configuration of a lighting device 1B in accordance with Embodiment 3 of the present invention.

A plurality of LEDs can be mounted in each of the divisional regions Rn. In the lighting device 1B illustrated in FIG. 6, an LED 11B is mounted in each of the divisional regions Rn. The LED 11B is composed of an LED 11Br which emits a red light beam, an LED11Bg which emits a green light beam, and an LED11Bb which emits a blue light beam. The LED 11B emits white light by mixture of the colored light beams from the LED 11Br, the LED 11Bg, and the LED 11Bb. This increases the color gamut of each of the divisional regions Rn.

Instead of the LEDs which emit light beams in different colors, a plurality of LEDs which emit white light beams can alternatively be mounted in each of the divisional regions Rn in order to increase the luminance.

The lighting device 1B with such a configuration has the light-emitting region E uniform in luminance and achieves desired high contrast and low power consumption as expected even though the lighting device 1B employs the local dimming technique.

Embodiment 4

The following description will discuss yet another embodiment of the present invention with reference to FIG. 7. For convenience of explanation, members having the same functions as those described in Embodiments 1 to 3 are given the same reference numerals, and explanations thereof are omitted here.

(a) of FIG. 7 is a plan view illustrating the configuration of a lighting device 1C in accordance with Embodiment 4 of the present invention, and (b) of FIG. 7 is a cross-sectional view of the lighting device 1C illustrated in (a) of FIG. 7.

The lighting device 1C differs from the lighting device 1 in that an inner frame (frame section) 31 is provided between the divisional regions Rn in the lighting device 1 (see FIG. 1, etc.) so as to make the divisional regions Rn separated physically. The other features of the lighting device 1C are identical to those of the lighting device 1.

The inner frame 31 includes circular-shaped parts and plate-like parts. The circular-shaped parts make the n-th ring regions Xn separated, and the plate-like parts make separated the divisional regions Rn into which each of the n-th ring regions Xn is equally divided.

The inner frame 31 stands upright from the surface of the mounting substrate 10 (the surface on which the LEDs 11 are mounted), and is in contact with the diffuser 13 at a top portion thereof. This allows each of the divisional regions Rn to be physically separated from adjacent ones of the divisional regions Rn. This allows light beams emitted from the LEDs 11 to be confined within the divisional regions Rn and exit through the diffuser 13. Thus it is possible to make the insides of the divisional regions Rn illuminated more uniformly.

The inner frame 31, which is similar to the frame 12, can be made from, for example, white resin such as polycarbonate. This makes it possible to increase the reflectivity. Further, the inner frame 31 preferably has a tapered shape. This further makes it possible to reflect light beams from the LEDs 11 so as to allow the light beams to exit efficiently to the outside through the diffuser 13.

Embodiment 5

The following description will discuss further another embodiment of the present invention with reference to FIGS. 8 and 9. For convenience of explanation, members having the same functions as those described in Embodiments 1 to 4 are given the same reference numerals, and explanations thereof are omitted here.

FIG. 8 is a plan view illustrating the configuration of a lighting device 1D in accordance with Embodiment 5 of the present invention. The lighting device 1D differs from the lighting device 1 (see FIG. 1, etc.) in that a light-emitting region ED is elliptical in shape instead of being circular in shape. The other features of the lighting device 1D are identical to those of the lighting device 1.

With a light-emitting region having an elliptical shape slightly deformed from a perfect circle, like the light-emitting region ED of the lighting device 1D, it is possible to reduce variations in luminance between the divisional regions Rn.

This is because the areas of the divisional regions Rn remain constant even when a change occurs in ellipticity of the light-emitting region ED, wherein the ellipticity is a ratio (a value obtained by dividing the length of a minor axis by the length of a major axis) between the length of the major axis (diameter extending in an up-down direction of a paper sheet of FIG. 8) and the length of the minor axis (diameter extending in a left-right direction of the paper sheet of FIG. 8).

Thus, the lighting device 1D has the light-emitting region ED uniform in luminance and thus achieves desired high contrast and low power consumption as expected even though the lighting device 1D employs the local dimming technique.

FIG. 9 is a plan view illustrating light-emitting regions ED having varying ellipticities.

(a) of FIG. 9 illustrates a light-emitting region ED having ellipticity of 1.0, (b) of FIG. 9 illustrates a light-emitting region ED having ellipticity of 0.9, (c) of FIG. 9 illustrates a light-emitting region ED having ellipticity of 0.8, (d) of FIG. 9 illustrates a light-emitting region ED having ellipticity of 0.7, (e) of FIG. 9 illustrates a light-emitting region ED having ellipticity of 0.6, (f) of FIG. 9 illustrates a light-emitting region ED having ellipticity of 0.5, (g) of FIG. 9 illustrates a light-emitting region ED having ellipticity of 0.4, and (h) of FIG. 9 illustrates a light-emitting region ED having ellipticity of 0.3.

As illustrated in FIG. 9, the shape of the light-emitting region ED gradually becomes longer and thinner as the ellipticity decreases or increases. Accordingly, each of the divisional regions Rn changes its shape into a longer and thinner shape. Thus, in a case where, for example, a single LED 11 is arranged in each divisional region Rn, it may be difficult for the single LED 11 to illuminate the whole divisional region Rn uniformly, depending on the position of each of the divisional regions Rn.

Thus, in a case where an equal number of LEDs 11 are mounted in each of the divisional regions Rn, it is preferable that the ellipticity is not less than 0.5 to not more than 1.0. This makes it possible to illuminate each of the divisional regions Rn uniformly. This allows the whole light-emitting region ED to have a uniform luminance.

In a case where the ellipticity is less than 0.5, it is possible to ensure uniformity of luminance between the divisional regions Rn by mounting a plurality of LEDs 11 on each of the divisional regions Rn and changing a pattern of locations of the plurality of LEDs 11 depending on the position of each of the divisional regions Rn in the light-emitting region ED.

Embodiment 6

The following description will discuss yet another embodiment of the present invention with reference to FIG. 10. For convenience of explanation, members having the same functions as those described in Embodiments 1 to 5 are given the same reference numerals, and explanations thereof are omitted here.

(a) of FIG. 10 is a plan view illustrating the configuration of a lighting device 1E in accordance with Embodiment 6 of the present invention, and (b) of FIG. 10 is a cross-sectional view illustrating the configuration of the lighting device 1E illustrated in (a) of FIG. 10.

The lighting device 1E differs from the lighting device 1 (see FIG. 1, etc.) in that a light-emitting region EE has a hole (through hole) 1Ea provided at the center thereof. The other features of the lighting device 1E are identical to those of the lighting device 1.

The hole 1Ea is provided at the center of a mounting substrate 10E and a diffuser 13E. The hole 1Ea is surrounded by an inner frame 12E which stands upright from the surface of the mounting substrate 10E and is in contact with the diffuser 13E at its top portion. With the frame 12E, it is possible to hold the diffuser 13E and prevent leakage of light beams from the LEDs 11 to the outside.

The hole 1Ea provided in the lighting device 1E can be used as a hole through which a shaft of an analog needle passes in a case where the lighting device 1E is used in a display device for a clock. This makes it possible to obtain a display device having an analog needle and being capable of displaying various images on a clock face. In addition, a display device having a variety of functions can be configured by placing, for example, a button or a switch into the hole 1Ea, or by placing, for example, a CCD or a sensor into the hole 1Ea. Furthermore, the lighting device 1E provided with the hole 1Ea can be a lighting device with improved design.

The hole 1Ea in (a) of FIG. 10 has a diameter equivalent to d and is circular in shape. The hole 1Ea is provided at a position corresponding to the position of the central region R0 (see FIG. 1, etc.) in the lighting device 1. Note that the hole 1Ea can be provided at a position corresponding to the positions of two or more regions of the n-th ring regions Xn (e.g. at a position corresponding to the positions of the central region R0 and the first ring region X1).

That is, the size of the hole 1Ea can be identical to that of the n-th ring region Xn. Note here that n is an integer satisfying $0<n<Xmax$.

In other words, the diameter of the hole 1Ea is any odd multiple of d. This makes it possible to provide the hole 1Ea within the light-emitting region EE, while making the areas of the divisional regions Rn equal. Thus, by using the hole 1Ea for various applications, it is possible to obtain a lighting device 1E and a display device both of which can be put into widespread use and can be used for a wide variety of applications.

[Recap]

A lighting device 1 in accordance with a first aspect of the present invention is such that assuming that L is an external diameter of a light-emitting region E for lighting an image display region (display region M) of an image display panel (liquid crystal panel 20), Xmax is the number of divisions for substantially concentrically dividing the light-emitting region E into substantially concentric ring-shaped regions, the substantially concentric ring-shaped regions are expressed as n-th ring regions Xn (where n is an integer satisfying $0 \leq n \leq Xmax$), and d is a radial pitch between point light sources (LEDs 11) which include a centered point light source and point light sources arranged substantially concentrically around the centered point light source, $d=L/(2Xmax+1)$, and that, in each of the n-th ring regions Xn, an 8n number of the point light sources (LEDs 11) are arranged at equal pitches in a circumferential direction and are positioned at a distance equivalent to a radius nd from the centered point light source (LED 11) around which the point light sources (LEDs 11) arranged substantially concentrically are positioned.

According to the above configuration, the areas of the divisional regions into which each of the n-th ring regions is equally divided such that each of the divisional regions contains one or more of the point light sources are equal. The areas of the divisional regions in all of the n-th ring regions where n is 0 through Xmax are equal, too. This makes the light-emitting region uniform in luminance even in a case where the light-emitting region is substantially circular in shape. Furthermore, by employing the so-called local dimming technique of performing luminance control on the light-emitting region on an individual predetermined region basis, the lighting device achieves desired high contrast and low power consumption.

The lighting device 1 in accordance with a second aspect of the present invention is preferably arranged such that, in the first aspect of the present invention, each of the substantially concentric ring-shaped regions has divisional regions Rn of equal area, the divisional regions Rn being regions into which each of the substantially concentric ring-shaped regions is divided at equal pitches in a circumferential direction such that each of the divisional regions contains a corresponding one or more of the point light sources (LEDs 11). This makes the divisional regions uniform in luminance. This consequently makes the light-emitting region uniform in luminance even in a case where the light-emitting region is substantially circular in shape. Furthermore, the lighting device 1, in which the areas of the divisional regions are not varied, achieves desired high contrast and low power consumption as expected even though the lighting device 1 employs the local dimming technique.

The lighting device 1 in accordance with a third aspect of the present invention is preferably arranged such that, in the first or second aspect of the present invention, the light-emitting region E is circular in shape. This makes it possible to make the divisional regions uniform in luminance with reliability.

The lighting device 1D in accordance with a fourth aspect of the present invention can be arranged such that, in the first or second aspect of the present invention, the light-emitting region ED is elliptical in shape. In the lighting device 1D with such a configuration, the areas of the divisional regions are also equal. Thus, it is possible to reduce variations in luminance of the divisional regions.

The lighting device 1D in accordance with a fifth aspect of the present invention can be preferably arranged such that, in the fourth aspect of the present invention, an ellipticity, which is a value obtained by dividing a length of a minor axis of the elliptical-shaped light-emitting region ED by a length of a major axis thereof, is not less than 0.5 to not more than 1.0. Even through an equal number of point light sources are provided in each of the divisional regions, the divisional regions can be illuminated uniformly with the point light sources. This allows the whole light-emitting region to have a uniform luminance.

The lighting device 1C in accordance with a sixth aspect of the present invention is preferably arranged such that, in the second aspect of the present invention, the point light sources (LEDs 11) are mounted on a surface of a mounting substrate 10, and the lighting device 1C further includes a frame section (inner frame 31), standing upright from the surface of the mounting substrate 10, for sectioning into the divisional regions Rn.

This allows light beams emitted from the point light sources to be reflected by the frame section and exit to the outside of the lighting device. Thus, it is possible to make the insides of the divisional regions illuminated more uniformly.

The lighting device 1E in accordance with a seventh aspect of the present invention can be arranged such that, in the first to sixth aspects of the present invention, the light-emitting region EE has a through hole (hole 1Ea) provided in the substantially concentric ring-shaped regions, the through hole (hole 1Ea) having a size equivalent to one or more of the n-th ring regions (where n is an integer satisfying $0<n<Xmax$).

The lighting device 1E in accordance with an eighth aspect of the present invention can be arranged such that, in the seventh aspect of the present invention, a diameter of the through hole (hole 1Ea) is any odd multiple of the radial pitch d.

This makes it possible to provide the through hole within the light-emitting region, while making the areas of the divisional regions equal. Thus, by using the through hole for various applications, it is possible to obtain a lighting device which can be put into widespread use and can be used for a wide variety of applications.

The lighting device 1 in accordance with a ninth aspect of the present invention is preferably arranged such that, in the first to eighth aspects of the present invention, the point light sources (LEDs 11) are drive-controllable on an individual basis. Thus, the lighting device configured such that the light-emitting region is substantially circular in shape can achieve a uniform luminance even though the lighting device employs the so-called local dimming technique.

The lighting device 1 in accordance with a tenth aspect of the present invention can be arranged such that, in the first to ninth aspects of the present invention, the point light sources are LEDs.

The display device 30 in accordance with an eleventh aspect of the present invention is preferably arranged to include the lighting device 1 and the image display panel (liquid crystal panel 20) which is lit by the lighting device 1.

The present invention is not limited to the embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

REFERENCE SIGNS LIST 1, 1A to 1E: Lighting device
10, 10E: Mounting substrate
11, 11B: LED (point light source)
12: Frame 12E: Frame (frame section)
13, 13E: Diffuser
20: Liquid crystal panel (image display panel)
21: Element substrate
22: Counter substrate
23: Seal
24: Liquid crystal layer
30: Display device
31: Inner frame (frame section)
R1, R2, R3, R4, R5, Rn: Divisional regions
X1: First ring region
X2: Second ring region
X3: Third ring region
X4: Fourth ring region
X5: Fifth ring region
Xn: n-th ring region

The invention claimed is:

1. A lighting device,
wherein assuming that L is an external diameter of a light-emitting region for lighting an image display region of an image display panel, Xmax is the number of divisions for substantially concentrically dividing the light-emitting region into substantially concentric ring-shaped regions, the substantially concentric ring-shaped regions are expressed as n-th ring regions (where n is an integer satisfying $0 \leq n \leq Xmax$), and d is a radial pitch between point light sources which include a centered point light source and point light sources arranged substantially concentrically around the centered point light source, $d=L/(2Xmax+1)$, and
wherein, in each of the n-th ring regions, an 8n number of the point light sources are arranged at equal pitches in a circumferential direction and are positioned at a distance equivalent to a radius nd from the centered point light source around which the point light sources arranged substantially concentrically are positioned.

2. The lighting device according to claim 1, wherein each of the substantially concentric ring-shaped regions has divisional regions of equal area, the divisional regions being regions into which each of the substantially concentric ring-shaped regions is divided at equal pitches in a circumferential direction such that each of the divisional regions contains a corresponding one or more of the point light sources.

3. The lighting device according to claim 1, wherein the light-emitting region is circular in shape.

4. The lighting device according to claim 1, wherein the light-emitting region is elliptical in shape.

5. The lighting device according to claim 4, wherein an ellipticity, which is a value obtained by dividing a length of a minor axis of the elliptical-shaped light-emitting region by a length of a major axis thereof, is not less than 0.5 to not more than 1.0.

6. The lighting device according to claim 2, wherein the point light sources are mounted on a surface of a mounting substrate, and said lighting device further includes a frame section, standing upright from the surface of the mounting substrate, for sectioning into the divisional regions.

7. The lighting device according to claim 1, wherein the light-emitting region has a through hole provided in the substantially concentric ring-shaped regions, the through hole having a size equivalent to one or more of the n-th ring regions (where n is an integer satisfying $0<n<Xmax$).

8. The lighting device according to claim 7, wherein a diameter of the through hole is any odd multiple of the radial pitch d.

9. The lighting device according to claim 1, wherein the point light sources are drive-controllable on an individual basis.

10. The lighting device according to claim 1, wherein the point light sources are LEDs.

11. A display device comprising:
a lighting device recited in claim 1; and
an image display panel which is lit by the lighting device.

* * * * *